US009156685B2

(12) United States Patent
Wu et al.

(10) Patent No.: US 9,156,685 B2
(45) Date of Patent: Oct. 13, 2015

(54) METHOD FOR THE PREVENTION OF SUSPENDED SILICON STRUCTURE ETCHING DURING REACTIVE ION ETCHING

(71) Applicant: Taiwan Semiconductor Manufacturing Co., Ltd., Hsin-Chu (TW)

(72) Inventors: Ting-Hau Wu, Yilan (TW); Kuei-Sung Chang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/664,967

(22) Filed: Mar. 23, 2015

(65) Prior Publication Data
US 2015/0191350 A1 Jul. 9, 2015

Related U.S. Application Data

(62) Division of application No. 13/673,223, filed on Nov. 9, 2012, now Pat. No. 8,987,845.

(51) Int. Cl.
*H01L 21/30* (2006.01)
*H01L 21/46* (2006.01)
*B81C 1/00* (2006.01)
*H01L 21/3065* (2006.01)

(52) U.S. Cl.
CPC ............ *B81C 1/00531* (2013.01); *B81C 1/0038* (2013.01); *B81C 1/00357* (2013.01); *H01L 21/3065* (2013.01)

(58) Field of Classification Search
CPC . H01L 21/3065; H01L 29/84; B81C 1/00531; B81C 1/0038; B81C 1/00357; B81C 1/00; B81C 1/00158; B81C 1/00476; B81C 1/00182; B81C 1/00134; B81C 1/00396; B81C 2201/014; B81C 2201/053; B81C 2201/0764; B81C 2203/0771
See application file for complete search history.

(56) References Cited

U.S. PATENT DOCUMENTS

| | | | |
|---|---|---|---|
| 7,128,843 B2* | 10/2006 | Mehta | 216/2 |
| 7,578,189 B1* | 8/2009 | Mehregany | 73/514.18 |
| 7,785,913 B2* | 8/2010 | Foster et al. | 438/53 |
| 8,470,628 B2* | 6/2013 | Guillorn et al. | 438/48 |
| 2010/0043546 A1* | 2/2010 | Kandori et al. | 73/504.12 |
| 2011/0012211 A1* | 1/2011 | Merz et al. | 257/415 |
| 2011/0156106 A1* | 6/2011 | Lee et al. | 257/254 |
| 2013/0285171 A1* | 10/2013 | Najafi et al. | 257/415 |
| 2014/0151823 A1* | 6/2014 | Chou | 257/415 |

OTHER PUBLICATIONS

Said Emre Apler, et al.; "A Compact Angular Rate Sensor System Using a Fully Decoupled Silicon-on-Glass MEMS Gyroscope"; Journal of Microelectromechanical Systems, vol. 17, No. 6, Dec. 2008, p. 1418-1429.
Non-Final Office Action dated Jul. 17, 2014 in connection with U.S. Appl. No. 13/673,223.
Notice of Allowance dated Nov. 14, 2014 in connection with U.S. Appl. No. 13/673,223.

* cited by examiner

*Primary Examiner* — Victor A Mandala
(74) *Attorney, Agent, or Firm* — Eschweiler & Associates, LLC

(57) ABSTRACT

The present disclosure is directed to a device and its method of manufacture in which a protective region is formed below a suspended body. The protective region allows deep reactive ion etching of a bulk silicon body to form a MEMS device without encountering the various problems presented by damage to the silicon caused by backscattering of oxide during over etching periods of DRIE processes.

20 Claims, 5 Drawing Sheets

METHOD FOR THE PREVENTION OF SUSPENDED SILICON STRUCTURE ETCHING DURING REACTIVE ION ETCHING

CROSS REFERENCE TO RELATED APPLICATIONS

This application is a Divisional Patent Application claiming priority to U.S. patent application Ser. No. 13/673,223 filed Nov. 9, 2012 now U.S. Pat. No. 8,987,845 and is hereby incorporated in its entirety.

BACKGROUND

Micro-Electro-Mechanical Systems (MEMS) refer to the integration of mechanical elements and electronics on a semiconductor substrate through microfabrication technology. While the electronics are fabricated using integrated circuit (IC) processes, the micromechanical elements are fabricated using compatible "micromachining" processes that selectively etch away parts of the silicon wafer to form the mechanical and electromechanical devices.

DETAILED DESCRIPTION

Figure 1A:
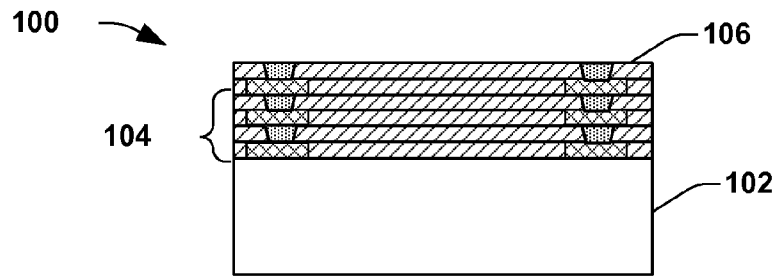
FIGS. 1A-1H are partial cross sectional views one embodiment of a device in accordance with the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

MEMS have been fabricated using modified versions of the same semiconductor fabrication technology used to make electronics (e.g., CMOS transistors). These include molding and plating, wet etching (e.g., potassium hydroxide (KOH) or tetra-methyl ammonium hydroxide (TMAH)), and dry etching (e.g., reactive ion etching (RIE) and deep reactive ion etching (DRIE)), electro discharge machining (EDM), and other technologies capable of manufacturing very small devices.

For some MEMS devices, the material used for fabrication processes can be etched. Deep reactive ion etching (DRIE) is a known process capable of performing deep, high aspect ratio anisotropic etches of silicon and polysilicon, and is desirable for producing semiconductor MEMS. A difficulty of micromachining MEMS using the DRIE process has been that, even with individual etch times calculated for each semiconductor wafer, it is difficult to not over etch or under etch certain features in the wafer. Over etching a wafer typically causes significant damage to the proof mass fingers and can render the device nonfunctional, leading to a significant reduction in wafer yield. On the other hand, under etching causes undesired electrical connections that also render the device nonfunctional. Because of non-uniformities that exist in the product wafers and the highly specialized DRIE equipment, it is not unusual to have both over etched and under etched devices on wafers processed by DRIE. The fact that there can be under etched and over etched die on a wafer indicates that the DRIE process window is smaller than is desirable for producing intricate MEMS devices.

The etch lag is believed to occur with essentially any suspended feature DRIE etched from a substrate above a cavity. Consequently, though the DRIE process has the capability of performing deep, high aspect ratio anisotropic etches in silicon and polysilicon, the etch lag associated with the DRIE process complicates the ability to utilize the DRIE process in the micromachining of essentially any suspended feature (e.g., cantilever, bridge, proof mass, finger, tether, etc.) used in a wide variety of devices, such as actuators and passive circuit elements, in addition to linear and rotational motion and acceleration sensors.

Additionally, backscattering of plasma ions from a dielectric layer, such as an oxide, during over etching in the DRIE process results in damage to the bottom surface of the bulk silicon structure from which the MEMS is formed.

There is, therefore, a need in the integrated circuit manufacturing art to develop a manufacturing process that will increase the process window while allowing for DRIE of the bulk silicon forming the MEMS structure without bottom damage to the structure.

Accordingly, the present disclosure is directed to a MEMS device, such as, in one embodiment, a micro-inertial/accelerometer sensor that detects a change in position of a suspended body corresponding to an acceleration experienced by the device, and a method for its fabrication. The method provides a protective region below the bulk silicon structure from which the MEMS device is formed which prevents backscattering during over etching periods. The method thus provides a smooth silicon bottom surface, while further allowing an increased process window.

FIGS. 1A-1H illustrate a plurality of partial cross section diagrams illustrating one embodiment of a method of forming a device at stages in the manufacturing process according to the disclosure. Referring to FIG. 1A, a semiconductor substrate 102 having an interconnect structure 104 thereon is provided. Substrate 102 is understood to include a semiconductor wafer or substrate, comprised of a semiconducting material such as silicon or germanium, or a silicon on insulator structure (SOI). Semiconductor substrate can further include one or more conductive layers (such as metal or silicon) and/or insulating layers, and one or more active or passive devices formed in or over the substrate or the like. A top or upper metal layer 106 is formed overlying interconnect structure 104.

Figure 1B:
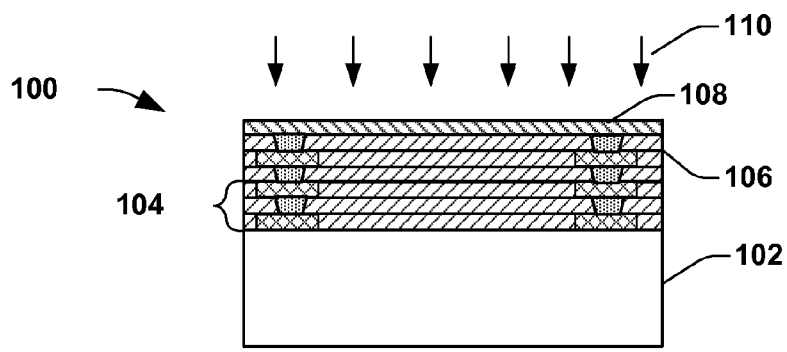
Figure 1C:
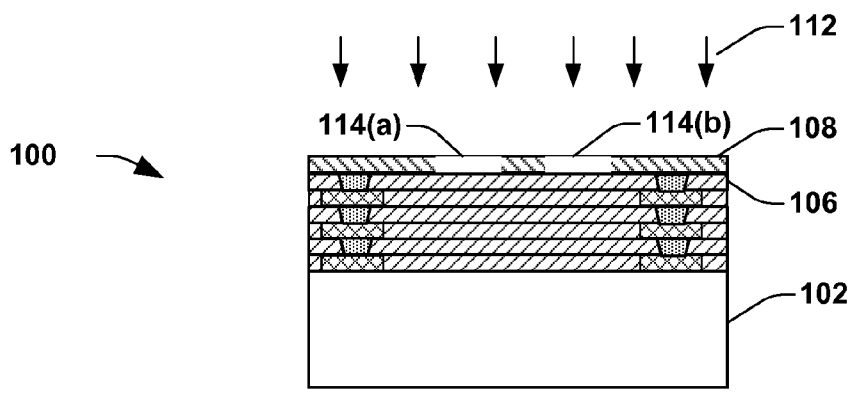

In FIG. 1B a dielectric layer 108 is formed by process 110 overlying top metal layer 106. Dielectric layer 108, in one embodiment, includes an oxide layer. It is contemplated that other types of dielectric layers may be used. Regardless of the type of dielectric layer 108 utilized, dielectric layer 108 is characterized by a first backscattering characteristic. In one embodiment, dielectric layer 108 is formed by chemical vapor deposition (CVD). In another embodiment, dielectric layer 108 may be formed by bonding, depositing, growing and thermally oxidizing, or other methods. A patterning step is then carried out to provide a mask, and in FIG. 1C, an etch process 112 is performed to form openings 114(a), 114(b) in the dielectric layer 108.

Figure 1D:
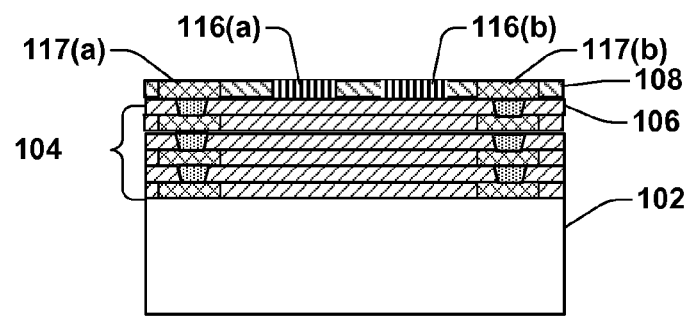

Referring to FIG. 1D, protective region 116(a), 116(b) is deposited overlying dielectric layer 108 and embedded in and filling openings 114(a), 114(b) in dielectric layer 108. In one embodiment, protective region 116(a), 116(b) includes a metal comprising one or more of Al, AlCu, Ti, TiN, TaN or Cu. The thickness of the protective region may be, in one embodiment, from about 0.4 microns to about 10 microns. In one embodiment, protective region 116(a), 116(b) is defined by a second backscattering characteristic. The second backscattering characteristic limits or reduces backscattering of plasma ions during a subsequent DRIE process, relative to the first backscattering characteristic of the dielectric layer 108. In one embodiment, a chemical mechanical polishing process (not shown) is then performed to remove protective region 116(a), 116(b) over dielectric layer 108 and leave a planarized protective region in openings 114(a), 114(b). In another embodiment, a dry etching process (not shown), may be performed to remove protective region over dielectric layer 108. In some embodiments, conductive regions 117a, 117b, which act as contacts to higher structures to be subsequently formed, can also be formed of the same metal as the protective region 116(a), 116(b) or of a different conductive material.

Figure 1E:
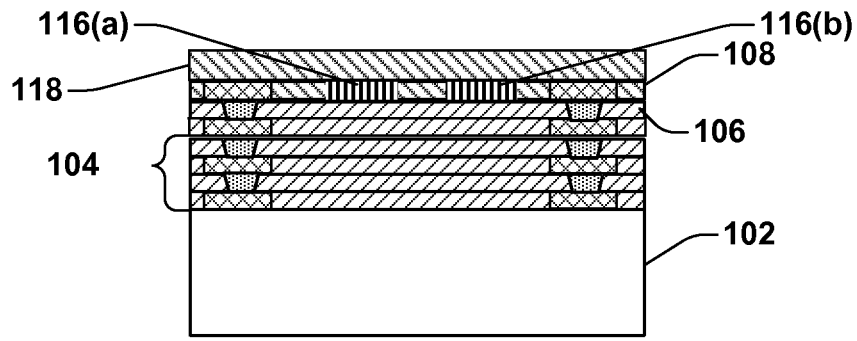
Figure 1F:
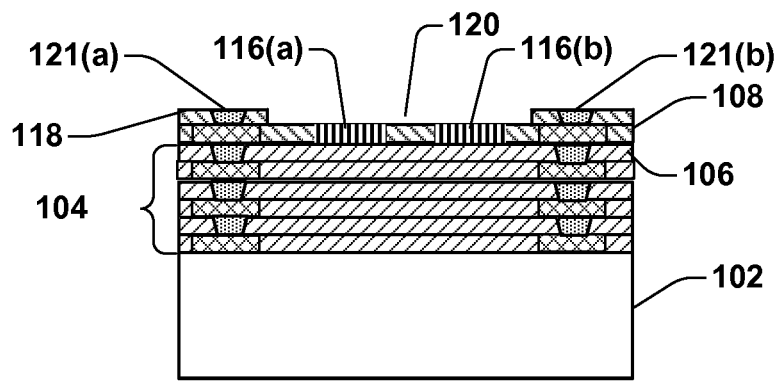

In FIG. 1E, a spacer layer 118 is formed overlying the protective region 116(a), 116(b) and dielectric layer 108. In one embodiment, the spacer layer 118 is a high density plasma oxide. In another embodiment, the spacer layer 118 is a silicon oxide ($SiO_2$) layer. In another embodiment, the spacer layer comprises polysilicon/$SiO_2$. The spacer layer 118 is then patterned utilizing a photolithography process (not shown) and an etch process is performed to remove a portion of the spacer layer 118 and thereby form air gap 120 and metal contacts 121(a), 121(b), while leaving the spacer layer 118 at least partially around a perimeter of the protective region 116(a), 116(b) and exposing the protective region 116(a), 116(b), as illustrated in FIG. 1F.

Figure 1G:
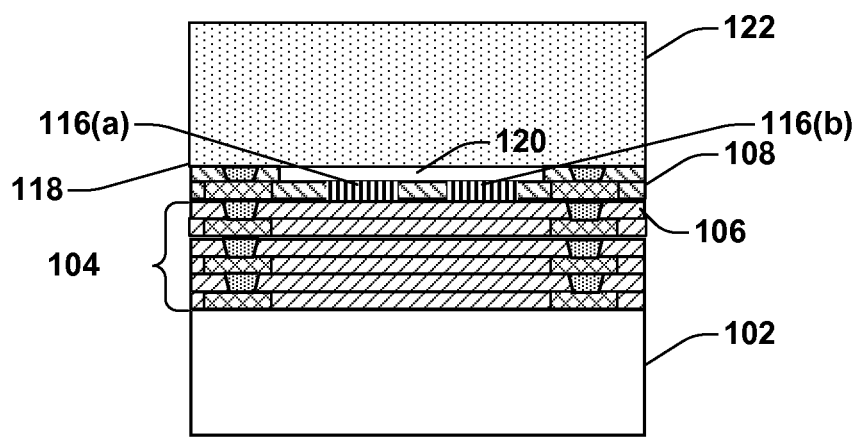

Following etching, a bulk silicon or MEMS device layer 122 is formed over the spacer layer 118 and dielectric layer 108, as illustrated in FIG. 1G. In one embodiment, the bulk silicon layer 122 is a doped silicon (Si) layer. In one embodiment, the bulk silicon layer 122 may include a bonded silicon on insulator (SOI) substrate. The bulk silicon layer 122 may be crystalline Si or poly Si. In alternative embodiments, the bulk silicon layer 122 may include a compound semiconductor such as silicon carbide, gallium arsenide, indium arsenide, and indium phosphide. In one embodiment, the bulk silicon layer 122 is fusion bonded to the spacer layer 118. The bonding process parameters will depend on metal pattern density and material properties. In one embodiment, a typical bonding temperature is approximately room temperature, for example 20° C., to approximately 200° C. Bonding force may be less than 5 kN and bonding time may be less than 10 minutes. However, it will be understood that other parameters may be used for bonding.

Figure 1H:
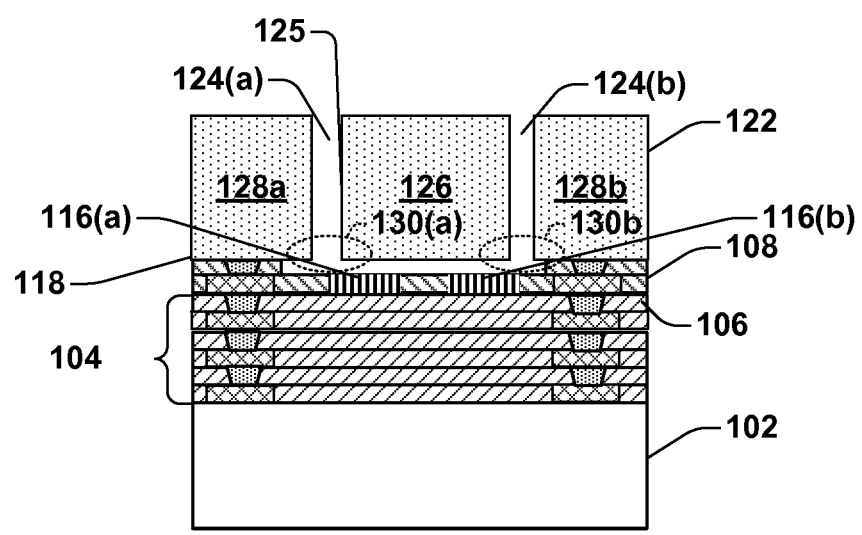

In FIG. 1H, the bulk silicon layer 122 is etched to form recesses 124(a), 124(b) which meet and include the air gap 120 and form suspended body 126. In one embodiment, etch process includes patterning a photolithography mask to define the desired etch pattern, such as defining the recesses 124(a), 124(b). In one embodiment, the etch process performed on the bulk silicon layer 122 includes a deep reactive ion etch (DRIE). It will be understood that the DRIE process may include an anisotropic etching process capable of forming deep holes and recesses. The DRIE process may include cryogenic or Bosch etching processes.

Notably, in the configuration of FIG. 1H and other configurations discussed herein, the protective layer 116a, 116b helps to limit backscattering of plasma ions that are used to form recesses 124(a), 124(b). If the protective layer were not in place, upon etching through the bottom of the recesses 124a, 124b and after meeting the air gap 120 (i.e., during any over etching), the plasma ions would strike the surface of dielectric layer 108 (which has a first backscattering characteristic) and some percentage of the ions would backscatter and strike the undersides of the suspended body 126 and support structures 128a, 128. This undesired backscattering of plasma ions can erode corners of the bulk silicon in areas 130a, 130b. To limit this undesired backscattering, the protective layer 116a, 116b, which has a second backscattering characteristic that limits backscattering relative to that of the dielectric layer 108, is formed under or near the suspended body 126, and therefore helps to limit damage to the undersides of the bulk silicon.

As illustrated in FIG. 1H, protective region 116(a), 116(b) is disposed, in one embodiment, below suspended body 126 and extending past an inner perimeter 125 of suspended body. It will be appreciated, however, further embodiments for placement of the protective region 116 are possible, and are discussed below with reference to FIGS. 2B-2D. These embodiments may provide various levels of protection against backscattering and accordingly limit damage of the bulk silicon layer due to the plasma etch.

Figure 2A:
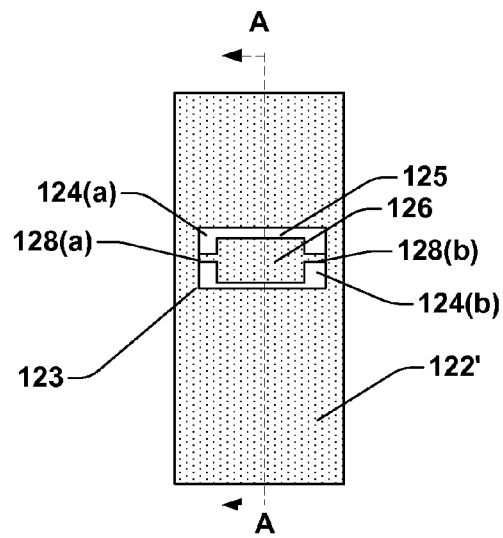
FIGS. 2A-2E are top views of FIG. 1H illustrating some embodiments of a device in accordance with the disclosure.

FIG. 2A illustrates a top view of FIG. 1H through in which etching of the bulk silicon layer 122 forms a suspended body 126 arranged in recesses 124(a), 124(b) having a first or outer perimeter 123. Suspended body 126 is defined by a second or inner perimeter 125. Suspended body 126 is supported by at least one support arm 128(a), 128(b) to couple the suspended body 126 to the support structure 122' formed from bulk silicon layer 122 overlying dielectric layer 108 and suspended over protective region 116.

Figure 2B:
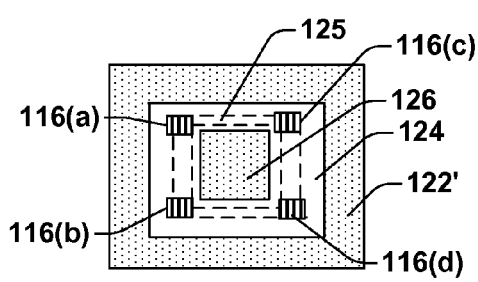
Figure 2C:
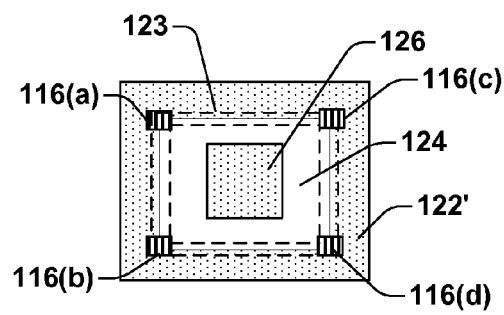
Figure 2D:
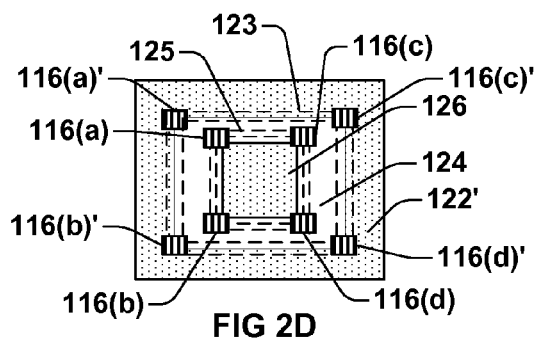
Figure 2E:
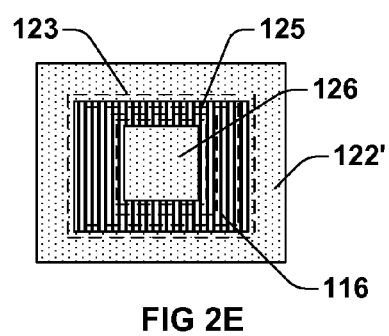

FIG. 2B illustrates an embodiment of protective region 116 in which protective regions 116(a), 116(b), 116(c), 116(d) are disposed at edges of second or inner perimeter 125 of suspended body 126, extending past edges of inner perimeter 125, as illustrated by dashed lines. In another embodiment, as illustrated in FIG. 2C, protective regions 116(a), 116(b), 116(c), 116(d) may be disposed at edges of first or outer perimeter 123 of support structure 122'. In a further embodiment, it is contemplated that protective regions 116(a)-116(d) and 116(a)'-116(d)', may be disposed at inner 125 and outer 123 perimeters, as illustrated in FIG. 2D. It will be understood that in embodiments 2B-2D that protective region 116 will always extend past an edge of inner or outer perimeter at a distance of from about 0.01 to about 0.5 microns. In a still further embodiment, as illustrated in FIG. 2E, protective region is contiguous with inner 125 and outer 123 perimeters.

Figure 3:
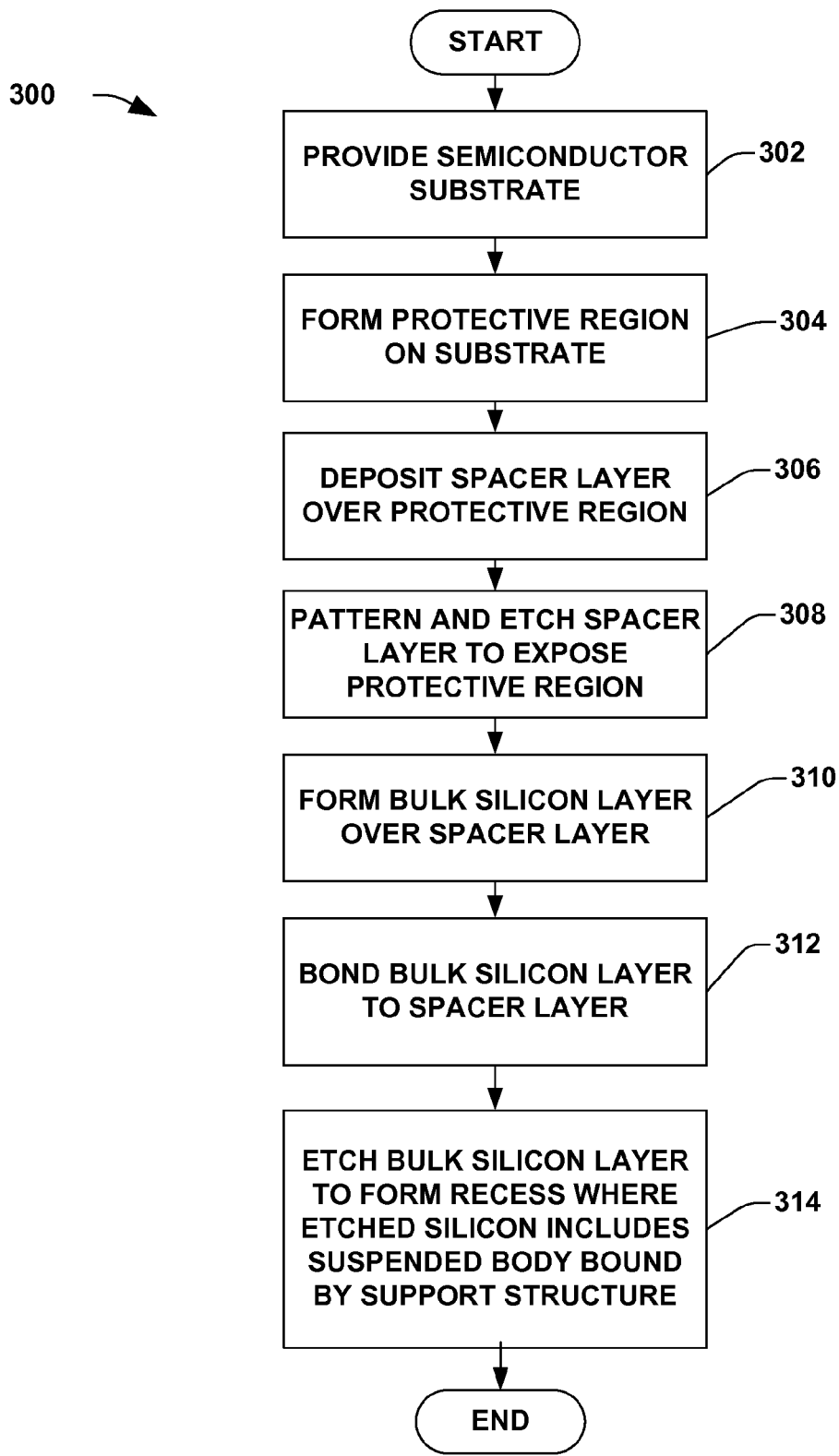
FIG. 3 illustrates a flow diagram of one embodiment of a method for the fabrication of a device in accordance with the disclosure.

FIG. 3 illustrates a flow diagram of some embodiments of a method 300 for formation of a semiconductor structure according to an embodiment of the invention. While method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 302 a semiconductor substrate is provided. Substrate can include an interconnect structure thereon. A protective region is formed overlying the substrate at step 304.

At step 306, a spacer layer is deposited over protective region.

At step 308, the spacer layer is patterned and etched to remove spacer layer at least partially, leaving a portion of spacer layer around a perimeter of the protective region, while exposing the protective region.

At step 310, a bulk silicon layer is formed over the spacer layer. The bulk silicon layer is then fusion bonded to the spacer layer, leaving an air gap between the protective region and the bulk silicon layer at step 312.

At step 314, the bulk silicon layer is etched to form a recess which meets the air gap. The etched silicon layer includes a suspended body bounded by a support structure and couple to the support structure by support arms. The method then ends.

Therefore, this methodology provides a MEMS device having a protective region which diminishes backscattering of plasma oxide and eliminates silicon bottom damage to the bulk silicon substrate during the DRIE process.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, some embodiments relate to a method of forming a device. In this method, a semiconductor substrate is provided, and a protective region is formed on the substrate. A spacer layer is deposited over the protective region. The spacer layer is patterned to leave the spacer layer at least partially around a perimeter of the protective region while exposing the protective region. A bulk silicon layer is formed over the spacer layer and the spacer layer is bonded to the bulk silicon layer. An air gap is left between the protective region and bulk silicon layer. The bulk silicon layer is etched to form a recess which meets the air gap, wherein the etched bulk silicon layer includes a suspended body of bulk silicon bounded by a support structure and coupled thereto by support arms.

The disclosure further relates to a method of forming a device comprising providing a semiconductor substrate and forming a protective region on the substrate. The method further includes depositing a spacer layer over the protective region and then patterning the spacer layer to leave the spacer layer at least partially around a perimeter of the protective region while exposing the protective region. The method further includes forming a bulk silicon layer over the spacer layer and bonding the spacer layer to the bulk silicon layer, wherein an air gap is left between the protective region and bulk silicon layer, followed by etching the bulk silicon layer to form a recess which meets the air gap, wherein the etched bulk silicon layer includes a suspended body of bulk silicon bounded by a support structure and coupled thereto by support arms.

Other embodiments relate to a method. In this method, a semiconductor substrate with an electrical interconnect structure disposed thereover is provided. The electrical interconnect structure includes conductive trenches and vias and has an upper surface made up of a dielectric surface region and a protective surface region. A bulk substrate is bonded or adhered to the upper surface of the electrical interconnect structure such that an air gap is formed between a lower surface of the bulk substrate and the upper surface of the electrical interconnect structure. An etch is performed to form a recess which extends through the bulk substrate and which meets the air gap. The recess is at least partially directly over the protective surface region.

Other embodiments relate to a method. In this method, a semiconductor substrate and an electrical interconnect structure disposed thereover is provided. The electrical interconnect structure includes conductive trenches and vias and has an upper surface made up of a dielectric surface region which abuts a protective surface region. A bulk substrate is bonded or adhered to the upper surface of the electrical interconnect structure such that an air gap is formed between a lower surface of the bulk substrate and the upper surface of the electrical interconnect structure. An etch is performed to form a recess which extends through the bulk substrate and which meets the air gap. The recess subdivides the bulk substrate into a rest mass or proof mass circumscribed by the recess and a periphery bulk substrate portion circumscribing the recess. The recess extends at least partially directly over the protective surface region and has support arms extending thereacross to couple the rest or proof mass to the periphery bulk substrate.

What is claimed is:

1. A method of forming a device, comprising:
receiving a semiconductor substrate;
forming a protective region on the substrate;
forming a spacer layer over the protective region;
patterning the spacer layer to leave the spacer layer at least partially around a perimeter of the protective region while exposing the protective region;
forming a bulk silicon layer over the spacer layer and bonding the spacer layer to the bulk silicon layer, wherein an air gap is left between the protective region and bulk silicon layer; and
etching the bulk silicon layer to form a recess which meets the air gap, wherein the etched bulk silicon layer includes a suspended body of bulk silicon bounded by a support structure and coupled thereto by support arms.

2. The method of claim 1, wherein forming the protective region includes depositing a metal overlying the semiconductor workpiece, the metal comprising one or more of Al, AlCu, Ti, TiN, TaN or Cu.

3. The method of claim 1, wherein etching provides an inner perimeter defined by the suspended body and an outer perimeter defined by the support structure.

4. The method of claim 3, wherein the protective region extends past an edge of the inner or the outer perimeter.

5. The method of claim 3, wherein the protective region is contiguous with the inner and outer perimeter.

6. The method of claim 1, wherein the etching of the bulk silicon layer comprises a deep reactive ion etching.

7. The method of claim 1, wherein the spacer layer comprises a high density plasma oxide.

8. The method of claim 1, wherein the protective region extends past the edge of the inner or outer perimeter at a distance of from about 0 to about 0.5 microns.

9. A method, comprising:
receiving a semiconductor substrate and an electrical interconnect structure disposed thereover, wherein the electrical interconnect structure includes conductive trenches and vias and has an upper surface made up of a dielectric surface region and a protective surface region;
bonding or adhering a bulk substrate to the upper surface of the electrical interconnect structure such that an air gap is formed between a lower surface of the bulk substrate and the upper surface of the electrical interconnect structure; and
performing an etch to form a recess which extends through the bulk substrate and which meets the air gap, wherein the recess is at least partially directly over the protective surface region.

10. The method of claim 9, wherein the dielectric surface region has a first backscattering characteristic and the protective surface region has a second backscattering characteristic that differs from the first backscattering characteristic, and wherein the etch backscatters to a first extent from material of the protective surface region and backscatters to a second, different extent from material of the dielectric surface region.

11. The method of claim 10, wherein the etch is a reactive ion etch (RIE), and wherein the lower surface of the bulk substrate, which is proximate to the recess and over the protective surface region, exhibits a lack of backscattering damage from the RIE.

12. The method of claim 9, wherein the protective surface region comprises one or more of Al, AlCu, Ti, TiN, TaN or Cu.

13. The method of claim 9, wherein performing the etch to form the recess frees a body of bulk substrate so the freed body of bulk substrate is suspended from a periphery portion of the bulk substrate by support arms.

14. The method of claim 13, wherein the freed body of bulk substrate corresponds to a rest mass or proof mass configured to detect a change in position of the suspended body corresponding to an acceleration.

15. The method of claim 13, wherein the recess is defined between an inner recess perimeter and an outer recess perimeter that each circumscribe the freed body of bulk substrate, and wherein the protective surface region has an edge that corresponds to a projection of the inner or outer recess perimeter onto the protective surface region.

16. The method of claim 14, wherein the recess is defined between an inner recess perimeter and an outer recess perimeter that each circumscribe the freed body of bulk substrate, and wherein the protective surface region extends continuously under the recess between the inner and outer recess perimeter.

17. The method of claim 16, wherein the protective surface region extends laterally in multiple directions beyond a projection of the inner and outer perimeters onto the protective surface region.

18. The method of claim 17, wherein the protective surface region extends past the inner or outer perimeter by a non-zero distance of less than 0.5 microns.

19. The method of claim 9, wherein the protective surface region has a thickness ranging from 0.4 microns to 10 microns.

20. A method, comprising:
receiving a semiconductor substrate and an electrical interconnect structure disposed thereover, wherein the electrical interconnect structure includes conductive trenches and vias and has an upper surface made up of a dielectric surface region which abuts a protective surface region;
bonding or adhering a bulk substrate to the upper surface of the electrical interconnect structure such that an air gap is formed between a lower surface of the bulk substrate and the upper surface of the electrical interconnect structure; and
performing an etch to form a recess which extends through the bulk substrate and which meets the air gap, wherein the recess subdivides the bulk substrate into a rest mass or proof mass circumscribed by the recess and a periphery bulk substrate portion circumscribing the recess, and wherein the recess is at least partially directly over the protective surface region and has support arms extending thereacross to couple the rest or proof mass to the periphery bulk substrate.

* * * * *